June 13, 1972 W. E. BEADLE ET AL 3,669,768

FABRICATION PROCESS FOR LIGHT SENSITIVE SILICON DIODE ARRAY TARGET

Filed Dec. 4, 1969 2 Sheets-Sheet 1

INVENTORS W. E. BEADLE
K. E. BENSON
J. R. MATHEWS
L. H. VON OHLSEN
BY H. W. Lockhart
ATTORNEY 3,669,768

FABRICATION PROCESS FOR LIGHT SENSITIVE SILICON DIODE ARRAY TARGET

William E. Beadle, Sinking Spring, Kenneth E. Benson, Allentown, James R. Mathews, Reading, and Louis H. Von Ohlsen, Jr., Greensfields, Pa., assignors to Bell Telephone Laboratories, Incorporated, Murray Hill and Berkeley Heights, N.J.

Filed Dec. 4, 1969, Ser. No. 882,235
Int. Cl. H01l *7/44*
U.S. Cl. 148—187 2 Claims

ABSTRACT OF THE DISCLOSURE

In the fabrication of silicon diode array targets for video camera tubes the initial PN junction diode diffusion heat treatments using a boron source, produces a P type sheet resistance in the range of 10 to 500 ohms per square. Values below this range produce a boron rich glass which is difficult to remove without producing defects. Values above this range do not produce sufficient boron rich glass to be effective in gettering certain impurities. This diffusion is followed by treatment at a temperature comparable to the diffusion temperature, for an appreciable period in a nitrogen atmosphere to minimize the occurrence of certain defects. The heat treatment of the semiconductor slice may, alternatively, terminate with a rapid cooling or quenching step.

Following the second impurity diffusion into the light sensitive face of the target an annealing treatment is performed for about one hour at a relatively low temperature in a reducing atmosphere, typically hydrogen, to minimize dark current.

BACKGROUND OF THE INVENTION

This invention relates to semiconductor target structures for video camera tubes and, more particularly, to the fabrication of semiconductor diode arrays comprising such target structures.

The following patents describe various forms of the semiconductor diode array useful as a target structure for video camera tubes:

U.S. Pat. 3,403,284, T. M. Buck et al., Sept. 24, 1968
U.S. Pat. 3,419,746, M. H. Crowell et al., Dec. 31, 1968
U.S. Pat. 3,458,782, T. M. Buck et al., July 29, 1969.

These patents describe the structure and mode of operation of semiconductor diode arrays suitable for use as in light sensitive targets in television type camera tubes. These disclosures likewise point out the advantages of semiconductor diode arrays for these applications and the problems faced in connection with their use.

The fabrication of the semiconductor diode target arrays has given rise to critical problems not generally faced heretofore in semiconductor device fabrication. As suggested in the foregoing noted patents it is critical that the many semiconductor diodes, numbering approximately 900,000 in a typical target, have uniform characteristics. Reference has also been made to the need for a very thin substrate having particular minority carrier lifetime characteristics. In particular, in the fabrication of semiconductor target arrays, it has been determined that certain aspects of this fabrication, and of slice material preparation as well, have a critical effect upon the imaging characteristics of the camera tube target. One important aspect relates to the occurrence of spurious signals arising from defects within the semiconductor body evidenced as myriad light spots in the image display screen. Whether few or many, these spurious indications mask and degrade a true, high quality image. In addition, certain types of contaminants which may diffuse into the silicon, affect not only image quality as mentioned heretofore, but tend to increase the bulk generation of dark current, that is, current generated even when no light impinges upon the target. The etching process to produce a thin substrate also may result in nonuniformities. In this connection, a thin substrate enhances the number of carriers transmitting the target cross section and also enables more complete gettering of impurities from active zones of the diodes.

Accordingly, although the semiconductor art is well developed with respect to the avoidance of contamination, certain specific processing techniques have been found advantageous and important in the production of high quality semiconductor diode array targets.

These process steps are in addition to unusual precautions relating to cleanliness and elimination of contamination.

SUMMARY OF THE INVENTION

According to this invention the foregoing problems relating to the making of high quality targets are solved, in considerable part, by adhering to a particular level of relative sheet resistance combined with a nitrogen ambient heat treatment in connection with the formation by diffusion of the PN junction diodes which comprise the target array. In particular, for silicon target material, a boron diffusion is used following the general technique of the patent to B. T. Howard, 3,066,052, granted Nov. 27, 1962. In particular, in this diffusion process it has been found advantageous to provide a sheet resistance for the boron diffused zones of between 10 and 500 ohms per square.

Following this diffusion, in a preferred embodiment, the semiconductor slice is heated for a period of several minutes, generally less than an hour, at a temperature comparable to the diffusion temperature and in a nitrogen atmosphere. This treatment is thought to inhibit the presence of precipitated impurities in the active zones of the PN junction diodes which otherwise contribute to high leakage currents. As an alternative, in lieu of the nitrogen heat treatment, the semiconductor slice is cooled rapidly after the diffusion treatment by withdrawal from the furnace into the room ambient so that its temperature drops to below 500° C. in a few seconds. This treatment is also effective in inhibiting precipitated impurities.

In a next step, the slice, except for a rim portion, is drastically reduced in thickness by an etching process which removes material from the undiffused, back surface of the target slice. This reduction in thickness of the substrate has several advantages, namely, the enabling of a greater number of transmitting carriers across the substrate and thus a stronger image signal and further, a more effective gettering of impurities from the active zones of the array by the subsequent impurity diffusion heat treatment on the back surface of the slice. The thinning also reduces the effect of lateral dispersion of the light-generated minority carriers and thus improves resolution.

Following cleaning operations and masking of certain surfaces the slice is subjected to a phosphorus diffusion over the back surface of the array to produce a layer of a few thousand Angstroms thickness of enhanced N type conductivity. This layer, in addition to enhancing the carrier collection efficiency of the target at short photon wavelengths, as set forth in the above-noted U.S. Pat. 3,458,782, acts also as a gettering layer tending to remove impurity elements from the active portions of the substrate which otherwise would increase the dark current and result in spurious signals in the video response of the target.

Following this second diffusion a final heat treatment is carried out at a low temperature and in a reducing atmosphere. Throughout the foregoing fabrication procedure the utmost cleanliness is adhered to in order to avoid effects from particulate matter which may find its way to the semiconductor slice surfaces as well as to eliminate chemical contamination which might result in the penetration of deleterious ionic matter.

BRIEF DESCRIPTION OF THE DRAWINGS

A more complete understanding of the invention may be obtained from the following detailed description taken together with the accompanying drawing in which.

DETAILED DESCRIPTION

Figure 1:
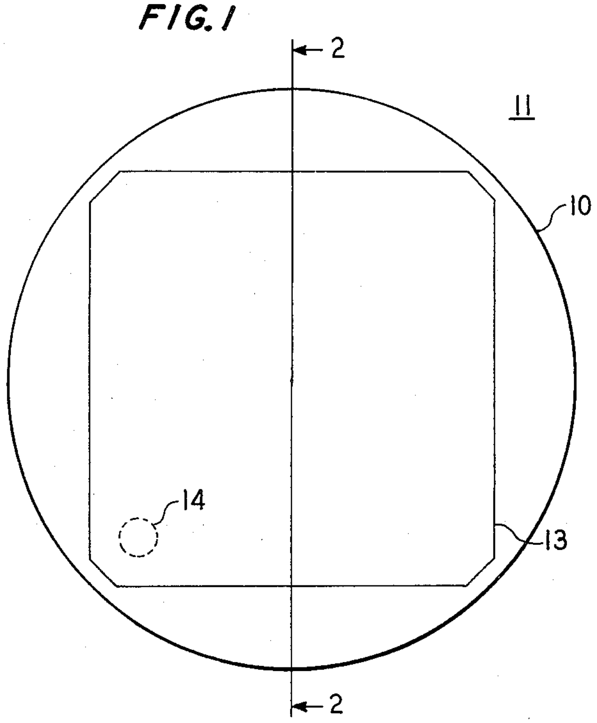
FIG. 1 is a schematic illustration of a silicon semiconductor slice showing the outline of the target array.
Figure 2:
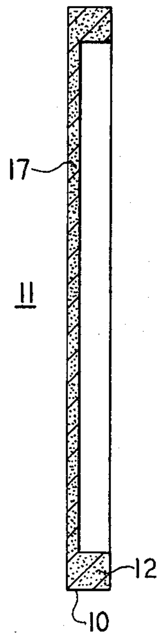
FIG. 2 is a cross section of a side elevation of the target slice.

FIG. 1 shows in circular outline 10 a slice 11 of semiconductor material forming a diode array target. Typically, the circular slice 11 is of silicon single crystal material taken from the cross section of a single crystal ingot and may have a diameter of .850 inch and a thickness, as shown in FIG. 2, of .006 inch (6 mils). Superimposed upon the face of slice 11 is a roughly square outline 13 which defines the diode array. In a typical embodiment this area 13 has dimensions of about .55 inch in the vertical direction and about .60 inch in the horizontal direction. Referring to FIG. 2 the light sensitive or target portion of the slice 11 has a very thin cross section 17 of about 15 microns supported by the 6 mil thick peripheral rim 12.

Figure 3:
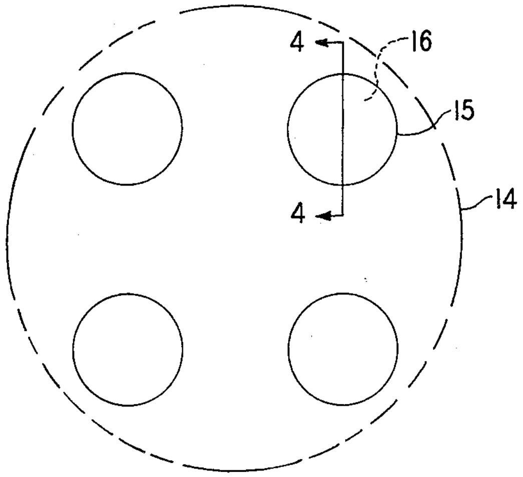
FIG. 3 shows a detailed portion of the target array surface.
Figure 4:
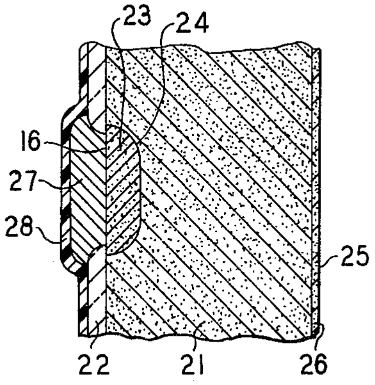
FIG. 4 is a cross section through one of the PN junction diodes of the target.

The area 14 indicated by the broken circular outline of FIG. 1 is detailed in FIG. 3 and includes four P type diffused areas 16. These areas 16 are on centers spaced 15 microns apart and each has a diameter of 10 microns. Referring to FIG. 4 there is shown a cross section through a single diffused area 16 showing the depth of the PN junction 24 defining the P type zone 23 which typically is about 25 microns, the area of the diffusion being delineated by the silicon oxide mask 22 on the surface of the N type slice 21. On the face 25 of the slice 21 opposite to the P type diffused areas 16 there is a thin uniform zone 26 of N type diffused material typically penetrating to a depth of about 0.2 micron. Over the surface 16 of the diffused zone 23 a conductive button is formed which extends slightly beyond the boundaries of the diffused zone 23 and overlays the silicon oxide layer 22. The advantage of such a conductive overlay has been previously disclosed in the above-noted Pat. 3,403,-284. Further, a resistive coating 28 typically of antimony trisulfide or gallium arsenide as disclosed in Pat. 3,419,-746, noted above, is formed over the entire surface of the diode array. The target may also be fabricated without the conducting buttons by restricting the resistive coating sheet resistance to $10^{13}$–$10^{14}$ ohms per square. The foregoing description indicates the critically fine dimensions of a semiconductor diode array target to which this invention appertains.

Figure 5:
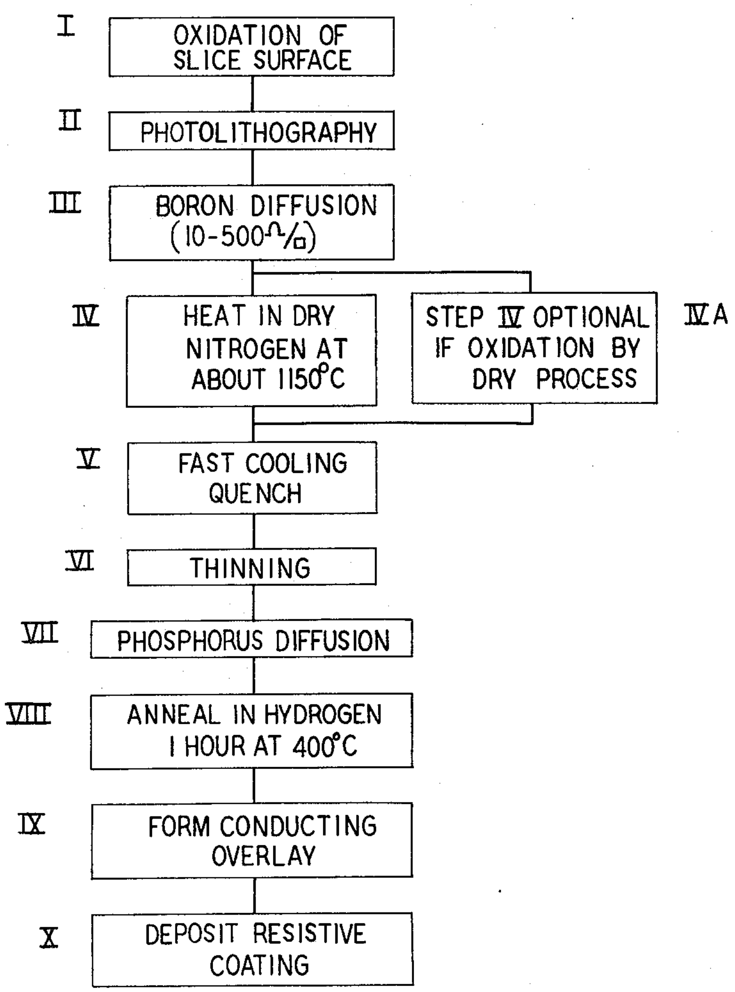
FIG. 5 is a diagram showing a sequence of steps for the fabrication of diode target arrays in accordance with the invention.

Referring to the sequence of steps set forth in the diagram of FIG. 5, fabrication of a particular target begins with a polishing and a preoxidation cleaning of the slice, not indicated in the drawing. It will be understood that in accordance with the art, the slice of monocrystalline silicon is produced from an ingot with desired crystalline orientation and is etched and polished typically to the dimensions mentioned heretofore in connection with the illustrations of FIGS. 1 and 2 to produce mirror-like, plane and parallel surfaces of the semiconductor slice. In a specific example, preoxidation cleaning consists of various solvent and chemical treatments, including acid cleaning and detergent brushing to produce contaminant free surfaces on the semiconductor slice.

In the initial step I shown in the chart of FIG. 5 the slice is subjected to an oxidation treatment to produce a coating of silicon dioxide on the surfaces thereof having a thickness of about 1 micron. This oxidation may be either a dry or wet process, the first comprising heating in a dry oxygen ambient at a temperature of about 1200° C. for about 22 hours; the second comprising a comparable heating at about 1100° C. temperature for about two hours using an ambient containing water vapor as well as oxygen. Both techniques are well known in the art. The techniques selected will govern to some extent the subsequent processing used to inhibit precipitation of impurities.

Following the oxidation treatment, the photolithographic process, now well known in the semiconductor art, is used to produce the silicon oxide diffusion mask defining the array of diode areas for the P type diffusion. This entire procedure involving application of photoresist, photographic exposure, development and related process is included within the second step II of the sequence designated as photolithography.

After the diode array mask has been formed in the silicon oxide the slice is again cleaned in preparation for the diffusion heat treatment. Then, in a particular diffusion procedure, step III, each masked slice is placed in a vertical position between disks of boron nitride in a suitable furnace using a dry argon atmosphere and heated at 870° C. for 20 minutes. This step constitutes a predeposition diffusion treatment in accordance with the teachings of the aforementioned Howard patent. Following this step the slices are placed immediately, without removing the boron glass formed during this deposition step, in a drive-in furnace and heated at 1150° C. for 45 minutes in a slightly oxidizing atmosphere. These steps constitute the boron diffusion treatment indicated by step III of the sequence diagram of FIG. 5. Typically, such a diffusion procedure results in a sheet resistivity in the boron diffused portion of between 10 and 500 ohms per square and a boron-rich glass layer both of which have been found most advantageous for good image quality.

Following the boron diffusion, step III, effective reduction of spurious signals in the image is achieved by alternative techniques depending, in part, upon the type of oxidation treatment used in step I. If the dry oxidation process is used, and as indicated by step V, a fast cooling quench upon termination of the diffusion process is effective in inhibiting impurity precipitation and reduction therefrom of spurious signals. Typically the slice is removed quickly from the diffusion furnace and allowed to cool in the room ambient to a temperature of less than 500° C. in a period of approximately 3 seconds. Thus, in accordance with this technique the heat treatment described as step IV may be omitted, as indicated by step IV–A.

If the nitrogen heat treatment is omitted, the diffusion time should be adjusted to achieve the desired function depth. Dry oxidation does not reduce the effectiveness of the step IV heat treatment, it reduces the need for that treatment. The inclusion of step IV with dry oxidation provides additional assurance of good image quality.

However, if the wet oxidation process has been used to oxidize the slice, a preferred procedure is the heat treatment set forth in step IV, using a nitrogen heat treatment at about 1150° C. for about 30 minutes, followed by the rapid cooling step V.

Following these steps and as indicated in step VI of the sequence diagram, the critical thinning operation is carried out in which the slice is thinned by removing material from the non-array face, reducing it from an original thickness of about 6 mils to about 15 microns in thickness as shown in FIG. 2. This web 17 is supported by a peripheral rim 12 of material of the original 6 mil thickness. Typically, this step is carried out by mounting each slice with the diffused face down and masking the peripheral portion with a suitably acid resistant mask such as a thin layer of apiezon wax. A suitable etchant is used to remove the unmasked portion of the silicon slice to the desired 15 micron thickness. One suitable etch comprises the following mixture: 6 lbs. of nitric acid ($HNO_3$), 3.95 lbs. acetic acid, 1 lb. of hydrofluoric acid and 66 grams of iodine dissolved into the acetic acid. The formation of this thin substrate or membrane is a critical procedure inasmuch as small variations in thickness produce spurious video signals and, therefore, precise etching steps are necessary to enable uniform thickness over the entire membrane area. Important requirements in connection with this etching practice are first, a clean silicon surface; second, rotation of the silicon slice about its own axis at a rate of typically about 90 r.p.m.; and third, a rim height such that the flow of etchant is not disturbed. A height of more than several mils should be avoided. Subsequent to the thinning operation, the slice is again carefully cleaned, particularly to completely remove wax residues or other masking materials. Then, as indicated by step VII of the sequence diagram, the phosphorus diffusion is performed on the slice surface opposite the diode array face using a source such as phosphorus oxychloride or phosphorus tribromide at a temperature of 870° C. for a total time of about 10 minutes. In a typical process, this heat treatment period comprises 5 minutes of preheating, and 5 minutes during which the diffusant is supplied. Typical gas flow constitutes 30 cubic centimeters per minute of nitrogen through the diffusant source, 1½ liters per minute of nitrogen and 75 cubic centimeters per minute of oxygen as diluents. This procedure resulted in a sheet resistance of 320 ohms per square to a depth of .15 microns.

Following the phosphorus diffusion step, the next significant process step as indicated in step VIII of the diagram comprises an annealing heat treatment of the slice. After the glassy coatings resulting from the boron and phosphorus diffusion steps have been removed, the slice is heated for about 1 hour at 400° C. in an atmosphere of pure hydrogen.

Following the annealing treatment of step VIII, conductive metal overlays are formed in the diode openings 16 and extending approximately 1 micron beyond the edge of P diffused zone 23. These overlays must not be interconnected and are insulated one from another by the intervening silicon oxide layer 22. These overlay conducting buttons may be produced by any one of several methods known in the art including photolithographic masking and metal evaporation and metal plating techniques. As mentioned hereinabove, the advantages of this conductive overlay is the subject of Pat. 3,403,284.

The final step denoted X in FIG. 5 is the deposition of a resistive coating 28 over the dioded array surface. A typical material for this coating is antimony trisulfide having a set resistance of from $10^{13}$ to $10^{15}$ ohms per square and a thickness of about 0.3 micron. Such a resistive layer may be formed by evaporation in a high vacuum.

The foregoing described process steps have been found to be important in the fabrication of silicon target arrays for video use which are free of defects of the kind which impair image quality. The reasons for the particular efficacy of certain of these steps are not completely understood, however, it is believed that, in particular, several heat treatment steps serve to inhibit what may be termed precipitation of certain inherent impurities found even in high purity silicon monocrystalline material or in the state of the art of semiconductor processing technology.

The nitrogen heat treatment should have a minimum duration for the embodiment described of about 25 minutes. In general, the time is determined by the quantity of impurity dissolved in the silicon material. The use of a hydrogen ambient for the annealing heat treatment should be restricted to relatively low heat treatment temperatures, typically below 500° C. In some circumstances where a higher temperature treatment is desirable for particular reasons, a gas mixture of hydrogen and an inert gas such as a forming gas mixture consisting of 15% hydrogen by volume and balance nitrogen may be found advantageous. Accordingly, those skilled in the art may find certain variations of the foregoing process within the limits described advantageous for other reasons; however, the important aspects of the invention lie in the succession of rapid cooling, annealing and gettering heat treatments following the impurity diffusions, the use of sufficiently conducting overlays to limit interconnection of diode array elements by inversion of the silicon surface, and the resistive coating on the array surface which avoids insulator storage and consequent cessation of target operation.

What is claimed is:

1. The method of fabricating a silicon diode target array for a video camera tube in which a thin slice of single crystal silicon semiconductor material has an array of PN junction diodes formed on one face by selective impurity diffusion, and has a layer of higher conductivity than the original slice formed on the other face by nonselective impurity diffusion, which method includes the following known steps: (1) heating the slice in a dry oxidizing atmosphere to form a layer of silicon dioxide on the surface of the slice, (2) forming a diffusion mask in the oxide layer on one face of the slice comprising an array of circular openings through said oxide layer, (3) a first impurity diffusion comprising heating the slice in an atmosphere including a conductivity type determining impurity at a temperature and for a time to form an array of PN junctions in the surface of said slice as defined by said openings through said oxide layer, said PN junctions being defined by impurity diffused conductivity type zones having a sheet resistance of between 10 and 500 ohms per square, and (4) a second impurity diffusion comprising heating said slice at a temperature below the temperature employed for said first diffusion, said second diffusion heat treatment being carried out in an atmosphere containing a conductivity type determining impurity opposite in type to that used in the first diffusion to form a layer of higher conductivity in the surface portion of said slice opposite said surface containing the array of PN junctions; the improvement comprising the steps of (a) immediately following the first diffusion step, the step of cooling said slice from the diffusion temperature to a temperature of less than 500 degrees in a period of not more than 3 seconds, and (b) the further improvement comprising the step of, following the second impurity diffusion, heating the slice to a temperature of about 400° C. for about one hour in an atmosphere of hydrogen.

2. The method of fabricating a silicon diode target array for a video camera tube in which a thin slice of single crystal silicon semiconductor material has an array of PN junction diodes formed on one face by selective impurity diffusion, and has a layer of higher conductivity than the original slice formed on the other face by nonselective impurity diffusion, which method includes the following known steps: (1) heating the slice in a wet oxidizing atmosphere to form a layer of silicon dioxide on the surface of the slice, (2) forming a diffusion mask in the oxide layer on one face of the slice comprising an array of circular openings through said oxide layer, (3) a first impurity diffusion comprising heating the slice in an atmosphere including a conductivity type determining impurity at a temperature and for a time to form an array of PN junctions in the surface of said slice as defined by said openings through said oxide layer, said PN junctions being defined by impurity diffused conductivity type zones having a sheet resistance of between 10 and 500 ohms per square, and (4) a second impurity diffusion comprising heating said slice at a temperature below the temperature employed for said first diffusion, said second diffusion heat treatment being carried out in an atmosphere containing a conductivity type determining impurity opposite in type to that used in the first diffusion to form a layer of higher conductivity in the surface portion of said slice opposite said surface containing the array of PN junctions; the improvement comprising the steps of (a) immediately following the first diffusion step, heating the slice at a temperature of about 1150° C. for about 30 minutes and then cooling said slice to a temperature of less than 500 degrees in a period of not more than 3 seconds, and (b) the further improvement comprising the step of, following the second impurity diffusion treatment, heating the slice to a temperature of about 400° C. for about one hour in an atmosphere of hydrogen.

References Cited

UNITED STATES PATENTS

| | | | |
|---|---|---|---|
| 2,771,382 | 11/1956 | Fuller | 148—1.5 |
| 2,819,191 | 1/1958 | Fuller | 148—1.5 |
| 3,207,635 | 9/1965 | Baron et al. | 148—1.5 |
| 3,365,793 | 1/1968 | Nechtow | 148—187 X |
| 3,389,023 | 6/1968 | Langdon | 148—187 |
| 3,556,880 | 1/1971 | Heiman et al. | 148—187 X |

L. DEWAYNE RUTTEDGE, Primary Examiner

J. M. DAVIS, Assistant Examiner

U.S. Cl. X.R.

148—1.5; 317—234 R